(12) United States Patent
Wierer et al.

(10) Patent No.: US 10,164,155 B2
(45) Date of Patent: Dec. 25, 2018

(54) SEMICONDUCTOR LIGHT EMITTING DEVICE WITH LIGHT EXTRACTION STRUCTURES

(71) Applicant: Lumileds LLC, San Jose, CA (US)

(72) Inventors: Jonathan J. Wierer, San Jose, CA (US); Aurelien Jean Francois David, San Jose, CA (US); Henry Kwong-Hin Choy, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/799,406

(22) Filed: Oct. 31, 2017

(65) Prior Publication Data

US 2018/0053880 A1     Feb. 22, 2018

Related U.S. Application Data

(60) Division of application No. 14/837,339, filed on Aug. 27, 2015, now Pat. No. 9,935,242, which is a
(Continued)

(51) Int. Cl.
*H01L 33/40* (2010.01)
*H01L 33/00* (2010.01)
(Continued)

(52) U.S. Cl.
CPC ........ *H01L 33/405* (2013.01); *H01L 33/0075* (2013.01); *H01L 33/20* (2013.01);
(Continued)

(58) Field of Classification Search
CPC ... H01L 33/405; H01L 33/0075; H01L 33/20; H01L 33/22; H01L 33/24; H01L 33/32; H01L 33/26
See application file for complete search history.

(56) References Cited

U.S. PATENT DOCUMENTS

| 5,376,580 A | 12/1994 | Kish et al. |
| 5,400,354 A | 3/1995 | Ludowise et al. |

(Continued)

FOREIGN PATENT DOCUMENTS

| EP | 1263058 | 12/2002 |
| EP | 1387413 | 2/2004 |

(Continued)

OTHER PUBLICATIONS

Buras et al., "Application of X-Ray Energy Dispersive Diffraction For Characterization Of Materials under High Pressure", Rise National Laboratory, Laboratory of Applied Physics, vol. 17, p. 93-138 (1989).

(Continued)

*Primary Examiner* — David A Zarneke
(74) *Attorney, Agent, or Firm* — Volpe and Koenig, P.C.

(57) ABSTRACT

A light emitting device is described. The light emitting device includes a substrate and a semiconductor structure. The semiconductor structure includes a light emitting layer disposed between an n-type region and a p-type region and has a first surface adjacent the substrate and a second surface opposite the first surface. The first surface of the semiconductor structure multiple cavities formed therein, which extend into at least one of the n-type region and the p-type region. The cavities are spaced apart and lined by a dielectric layer. At least a portion of the second surface is roughened to form multiple features spaced apart at a distance smaller than a distance between each of the cavities formed in the first surface to enhance extraction of light emitted from the light emitting layer. At least one contact is disposed between the first surface of the semiconductor structure and the substrate.

10 Claims, 9 Drawing Sheets

Related U.S. Application Data continuation of application No. 13/540,913, filed on Jul. 3, 2012, now Pat. No. 9,142,726, which is a continuation of application No. 13/161,541, filed on Jun. 16, 2011, now Pat. No. 8,242,521, which is a division of application No. 11/960,180, filed on Dec. 19, 2007, now Pat. No. 7,985,979.

(51) Int. Cl.
*H01L 33/20* (2010.01)
*H01L 33/22* (2010.01)
*H01L 33/24* (2010.01)
*H01L 33/26* (2010.01)
*H01L 33/32* (2010.01)

(52) U.S. Cl.
CPC .............. *H01L 33/22* (2013.01); *H01L 33/32* (2013.01); *H01L 33/24* (2013.01); *H01L 33/26* (2013.01); *H01L 2933/0016* (2013.01)

(56) References Cited

U.S. PATENT DOCUMENTS

| | | | |
|---|---|---|---|
| 5,696,389 | A | 12/1997 | Ishikawa et al. |
| 5,779,924 | A | 7/1998 | Krames et al. |
| 5,793,062 | A | 8/1998 | Kish, Jr. et al. |
| 5,917,202 | A | 6/1999 | Heitz et al. |
| 6,091,085 | A | 7/2000 | Lester |
| 6,277,665 | B1 | 8/2001 | Ma et al. |
| 6,455,878 | B1 | 9/2002 | Bhat et al. |
| 6,518,598 | B1 | 2/2003 | Chen |
| 6,573,537 | B1 | 6/2003 | Steigerwald et al. |
| 6,611,002 | B2 | 8/2003 | Weeks et al. |
| 6,784,462 | B2 | 8/2004 | Schubert |
| 6,869,820 | B2 | 3/2005 | Chen |
| 6,891,197 | B2 | 5/2005 | Bhat et al. |
| 6,903,376 | B2 | 6/2005 | Shen et al. |
| 6,914,268 | B2 | 7/2005 | Shei et al. |
| 6,946,788 | B2 | 9/2005 | Suehiro et al. |
| 6,958,498 | B2 | 10/2005 | Shelton et al. |
| 6,969,874 | B1 | 11/2005 | Gee et al. |
| 6,995,032 | B2 | 2/2006 | Bruhns et al. |
| 7,053,420 | B2 | 5/2006 | Tadatomo et al. |
| 7,071,494 | B2 | 7/2006 | Steigerwald et al. |
| 7,187,753 | B2 | 3/2007 | Freudenberger et al. |
| 7,235,820 | B2 | 6/2007 | Shim et al. |
| 7,256,483 | B2 | 8/2007 | Epler et al. |
| 7,265,392 | B2 | 9/2007 | Hahn et al. |
| 7,274,040 | B2 | 9/2007 | Sun |
| 7,294,864 | B2 | 11/2007 | Kim et al. |
| 7,294,866 | B2 | 11/2007 | Liu |
| 7,420,218 | B2 | 9/2008 | Nagai |
| 7,470,938 | B2 | 12/2008 | Lee et al. |
| 7,511,311 | B2 | 3/2009 | Kususe et al. |
| 7,633,097 | B2 | 12/2009 | Kim et al. |
| 7,635,875 | B2 | 12/2009 | Niki et al. |
| 7,683,386 | B2 | 3/2010 | Tanaka et al. |
| 7,935,554 | B2 | 5/2011 | Lee et al. |
| 8,049,233 | B2 | 11/2011 | Fukshima et al. |
| 8,207,550 | B2 | 6/2012 | Chen et al. |
| 8,592,800 | B2 | 11/2013 | Moustakas et al. |
| 9,178,112 | B2 | 11/2015 | Kim |
| 9,196,763 | B2 | 11/2015 | Nagel et al. |
| 9,647,173 | B2 | 5/2017 | Kim et al. |
| 2001/0010449 | A1* | 8/2001 | Chiu ........................ H01L 33/22 313/501 |
| 2002/0195609 | A1* | 12/2002 | Yoshitake ............... H01L 33/22 257/81 |
| 2003/0087467 | A1* | 5/2003 | Oohata ................... H01L 33/22 438/47 |
| 2003/0143772 | A1 | 7/2003 | Chen |
| 2005/0037526 | A1 | 2/2005 | Kamiyama et al. |
| 2005/0104080 | A1 | 5/2005 | Ichihara et al. |
| 2005/0145873 | A1 | 7/2005 | Pan et al. |
| 2005/0179130 | A1 | 8/2005 | Tanaka et al. |
| 2005/0189558 | A1 | 9/2005 | Liu |
| 2006/0043388 | A1 | 3/2006 | Kwak et al. |
| 2006/0071225 | A1 | 4/2006 | Beeson et al. |
| 2006/0081869 | A1 | 4/2006 | Lu et al. |
| 2006/0108593 | A1 | 5/2006 | Kim et al. |
| 2006/0222040 | A1 | 10/2006 | Schmid et al. |
| 2006/0225644 | A1 | 10/2006 | Lee et al. |
| 2006/0267034 | A1 | 11/2006 | Orita |
| 2006/0284190 | A1 | 12/2006 | Zimmerman et al. |
| 2007/0018182 | A1 | 1/2007 | Beeson et al. |
| 2007/0020788 | A1 | 1/2007 | Liu et al. |
| 2007/0108459 | A1 | 5/2007 | Lu |
| 2007/0114564 | A1 | 5/2007 | Lee et al. |
| 2007/0145380 | A1 | 6/2007 | Shum et al. |
| 2008/0135861 | A1 | 6/2008 | Pokrovskiy et al. |
| 2009/0045427 | A1 | 2/2009 | Wierer, Jr. et al. |
| 2009/0046479 | A1 | 2/2009 | Bierhuizen et al. |
| 2009/0014751 | A1 | 3/2009 | Kim et al. |
| 2009/0086508 | A1 | 4/2009 | Bierhuizen |
| 2009/0305446 | A1 | 12/2009 | David et al. |
| 2010/0096652 | A1 | 4/2010 | Choi et al. |
| 2010/0059789 | A1 | 9/2010 | Choi |
| 2011/0210312 | A1 | 9/2011 | Tu et al. |
| 2012/0018734 | A1 | 1/2012 | Chae et al. |
| 2017/0194532 | A1 | 7/2017 | Lin et al. |

FOREIGN PATENT DOCUMENTS

| | | |
|---|---|---|
| EP | 1662584 | 5/2006 |
| EP | 1 717 870 | 11/2006 |
| JP | 10163536 | 6/1998 |
| JP | 2004095959 | 3/2004 |
| JP | 2005-317959 | 11/2005 |
| JP | 2006245058 | 9/2006 |
| JP | 2007173579 | 7/2007 |
| JP | 2007-529879 | 10/2007 |
| JP | 2007273975 | 10/2007 |
| RU | 2286618 | 10/2006 |
| WO | 2006131087 | 12/2006 |

OTHER PUBLICATIONS

CN First Office Action, Application No. 200880121356.3, dated Oct. 14, 2011, 7 pages.
CN Second Office Action, Application No. 200880121356.3, dated Jun. 20, 2012, 13 pages.
CN Third Office Action, Application No. 200880121356.3, dated Jan. 10, 2013, 7 pages.
EPO as ISA, PCT/IB2008/055430 filed Dec. 18, 2008, "International Search Report and Written Opinion", dated May 26, 2009.
Halgenstein et al., "The Energy Calibration of X-Ray Absorption Spectra Using Multiple Beam Diffraction" Review of Scientific Instruments, No. 1, p. 911-913 (Jan. 1992).
KR OA2MO, Application 10-2016-7005175, LUM reference 2007P01736KR03, Apr. 7, 2016, 6 pps.
Russian Official Action, Application No. 2010129431, dated Nov. 19, 2012, 3 pages.
Streubel et al., "High Brightness AlGaInP Light-emitting Diodes", IEEE Journal on Selected Topics in Quantum Electronics, vol. 8, No. 2, p. 321-332 (Mar./Apr. 2002).
Taiwan Office Action, Application No. 097149448, dated Nov. 26, 2014, 12 pages.
WOKR—Office Action, Korean Application No. 10-2010-7015938, dated Apr. 19, 2015, 8 pages.

* cited by examiner

SEMICONDUCTOR LIGHT EMITTING DEVICE WITH LIGHT EXTRACTION STRUCTURES

CROSS REFERENCE TO RELATED APPLICATION(S)

This is a divisional of U.S. application Ser. No. 14/837,339, filed on Aug. 27, 2015, which is a continuation of U.S. application Ser. No. 13/540,913, filed Jul. 3, 2012, now U.S. Pat. No. 9,142,726, which is a continuation of U.S. application Ser. No. 13/161,541, filed Jun. 16, 2011, by Aurelien J. F. David et al., titled "Semiconductor light emitting device with light extraction structures", now U.S. Pat. No. 8,242,521, which is a division of U.S. application Ser. No. 11/960,180, filed Dec. 19, 2007, by Aurelien J. F. David et al., titled "Semiconductor light emitting device with light extraction structures", now U.S. Pat. No. 7,985,979. All previously filed applications are incorporated herein by reference.

BACKGROUND

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

SUMMARY

In accordance with embodiments of the invention, structures are incorporated into a light emitting device which may increase the extraction of light emitted at glancing incidence angles. The light emitting device may be, for example, a III-nitride thin-film flip-chip light emitting diode.

In some embodiments, the device includes a structure that directs light away from the metal contacts by total internal reflection. For example, the device may include a semiconductor structure comprising a light emitting layer disposed between an n-type region and a p-type region. A reflective metal contact is disposed on the bottom side of the semiconductor structure and is electrically connected to the p-type region. A low index material is disposed between at least a portion of the reflective metal contact and the p-type region. The difference in refractive index between the low index material and the p-type region, and the thickness of the low-index layer, are selected to ensure total internal reflection of glancing angle light. For example, the difference between the index of refraction of the low index material and the index of refraction of the p-type region may be at least 0.4. The interface between the semiconductor structure and the low index material is configured to efficiently reflect light incident on the interface at glancing angles, i.e. at angles greater than 70° relative to a normal to a major plane of the light emitting layer.

In some embodiments, the device includes extraction features which may extract glancing angle light directly, or direct the glancing angle light into smaller incidence angles which are more easily extracted from the device. For example, the features may be cavities in the semiconductor structure which extend from the top or bottom surface of the semiconductor structure. The cavities may have sidewalls oriented at an angle between 35 and 55° relative to a major surface of the light emitting layer. The sidewalls of the cavities may be fully or partially lined with a dielectric material. The cavities may be filled with a metal. In some embodiments, the metal makes electric contact with the n-type region.

BRIEF DESCRIPTION OF THE DRAWINGS

FIG. 14A shows two rays propagating in a thin low index layer. FIG. 14B shows a ray propagating in a thick low-index layer.

DETAILED DESCRIPTION OF THE PREFERRED EMBODIMENTS

Figure 1:
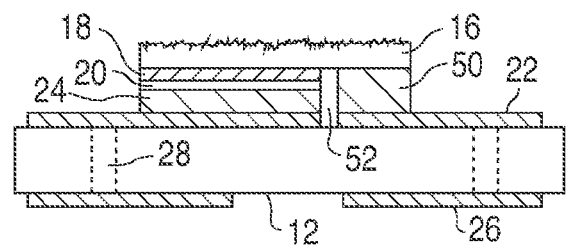
FIG. 1 illustrates a III-nitride thin-film flip-chip light emitting device.

FIG. 1 illustrates a III-nitride flip-chip, thin-film LED described in more detail in U.S. Pat. No. 7,256,483, which is incorporated herein by reference. N-type layers 16, an active layer 18, and p-type layers 20 are grown over any suitable substrate, such as, for example, sapphire or SiC. The p-layer surface is highly doped to form an ohmic contact with a die metallization layer 24 (e.g., Ag). Metallization 24 may be highly reflective to light emitted by the active layer. Portions of the p-layer 20 and active layer 18 are etched away during the LED forming process, and metal 50 (metallization layer plus bonding metal) contacts the n-layer 16 on the same side of the device as the p-contact metal 24.

The n-metal 50 and p-metal 24 are bonded to the pads 22 on a package substrate 12. An underfill material 52 may be deposited in the voids beneath the LED to reduce thermal gradients across the LED, to add mechanical strength to the attachment, and to prevent contaminants from contacting the LED material. The bond technology may be solder, thermocompression, interdiffusion, or a gold stud bump array bonded by an ultrasonic weld. The combination of the die metallization and bond material is shown as metals 24 and 50 and may include a diffusion barrier or other layers to protect the optical properties of the metallization layer adjacent the semiconductor material. The package substrate 12 may be formed of the electrically insulating material MN, with gold contact pads 22 connected to solderable electrodes 26 using vias 28 and/or metal traces. Alternatively, the package substrate 12 may be formed of a conducting material if passivated to prevent shorting, such as anodized AlSiC. The package substrate 12 may be thermally conductive to act as a heat sink or to conduct heat to a larger heat sink.

The growth substrate may be removed using an excimer laser beam. The laser beam melts the GaN material at its interface with the growth substrate, allowing the growth substrate to then be lifted off. Alternatively, the growth substrate may be removed by etching such as RIE etching, by liftoff techniques such as etching away a layer between the growth substrate and the LED layers, or by lapping.

The exposed, relatively thick GaN layer 16 is optionally thinned by etching using a dry etch such as RIE. In one example, the thickness of the GaN layer 16 being etched is 7 μm, and the etching reduces the thickness of the GaN layer 16 to approximately 1 μm. If the initial thickness of all the epitaxial LED layers is 9 μm, in this case the etching causes the total thickness of the LED layers to be 3 μm. The total thickness of the semiconductor structure in a finished device may be 10 μm or less in some embodiments, 5 μm or less in some embodiments, 2 μm or less in some embodiments, and 1 μm or less in some embodiments. The thinning process removes damage caused by the laser lift off process, and reduces the thickness of the optically absorbing layers that are no longer needed, such as a low temperature GaN nucleation layer and adjacent layers. All or a portion of the n-type cladding layer adjacent to the active region is left intact.

The top surface of the LED (n-layer 16) is textured for increased light extraction. In one embodiment, layer 16 is photo-electrochemically etched using a KOH solution 46. This forms a "white" roughness in the GaN surface (having n-type Si doping). This etching process can also be used to further thin the n-layer 16 and stop at a predetermined thickness using an etch stop layer grown during the LED formation process, leaving a smooth surface. This latter approach is useful for resonant device designs. For such devices, a mirror stack (e.g., a Bragg reflector) may now be deposited on the top surface of the LED. Additional light extraction techniques could include micron or nanometer scale patterned etching (dimple or photonic crystal).

In the device illustrated in FIG. 1, in general, the characteristic size of the surface texturing in either a surface with random texturing or with ordered texturing is on the order of one wavelength of light emitted by the active region. Performance of such devices depends on the relative efficiency of light-extracting process and of absorption processes in the device, such as absorption by the active region and by the metal contacts. Absorption processes typically amount to a few percent (1 to 10%) per bounce. Light extraction from a device is efficient if the light-extraction rate per bounce is stronger than the absorption rate per bounce.

Figure 2:
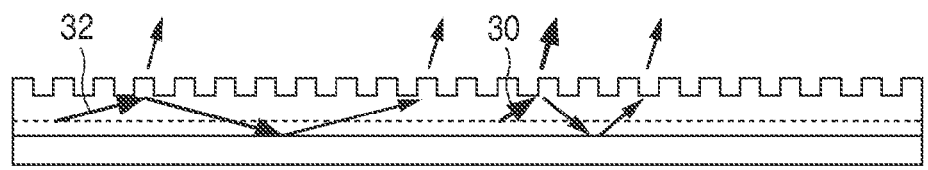
FIG. 2 illustrates a III-nitride device with a photonic crystal formed in the top surface.
Figure 8:
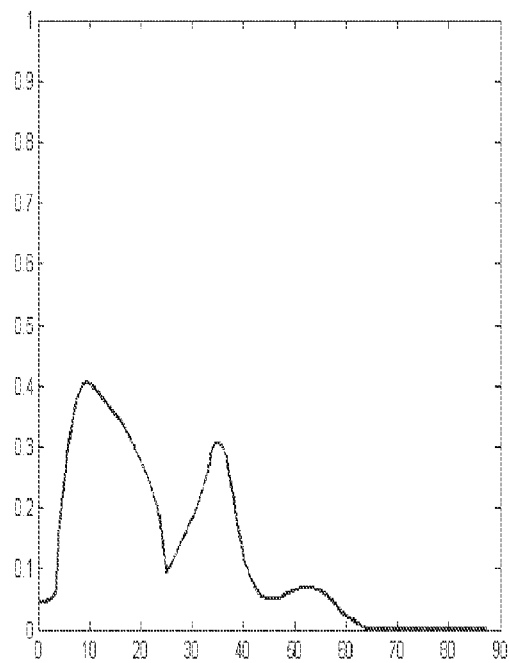
FIG. 8 is a plot of extraction as a function of angle of incidence, which illustrates the one-pass extraction efficiency for a plane wave impinging on a GaN/air photonic crystal (whose period and depth are of the order of a wavelength).

Light extraction from a textured surface can depend strongly on the angle of incidence of light. Light impinging on the surface at small angles relative to a normal to the top surface, shown in FIG. 2 as light 30, is easily extracted. Light impinging on the surface at large angles relative to a normal to the top surface, referred to herein as glancing angle light, shown in FIG. 2 as light 32, is more difficult to extract. Most of the glancing angle light is reflected back into the LED, either by specular reflection or by backscattering as illustrated in FIG. 2. The reflected light is susceptible to absorption. The extraction efficiency of glancing angle light, for example incident in the range of angles between 70 and 90° relative to a normal to the top surface of the device, is only a few percent. This is illustrated in FIG. 8, which shows the one-pass extraction for a plane wave impinging on a photonic crystal versus angle (0° is perpendicular to the plane of the light extraction surface, i.e. the top of n-type region 16). At large angles (glancing angles), the extraction is less than at small angles, thus requiring more bounces for extraction.

Figure 9:
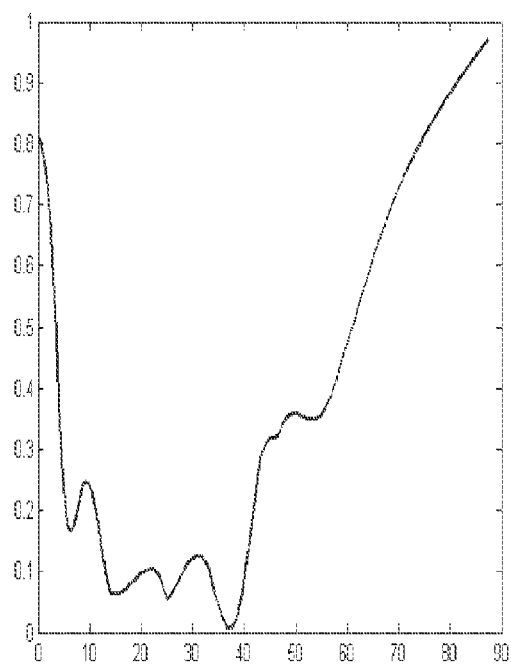
FIG. 9 is a plot of extraction as a function of angle of incidence, which illustrates the one-pass specular reflection (e.g. the fraction of light which is backscattered with the same angle as its incidence angle) for the same structure as FIG. 8.

Light which is backscattered at glancing angles mostly undergoes specular reflection (as opposed to diffuse scattering) and keeps the same incident angle. This is illustrated in FIG. 9 which shows the one-pass specular reflection versus angle (0° is perpendicular to the plane of the light extraction surface) for the same structure as FIG. 8. At glancing angles, a large fraction of the light undergoes specular reflection. The textured surface is therefore not a good mechanism for converting glancing angle light to light propagating at smaller angles, which is more easily extracted. Since light emitted at glancing incidence angles represents a significant portion of light emitted by the device (about 40% in some devices), it is desirable to extract glancing angle light in order to improve the extraction efficiency of the device. Although the results illustrated in FIGS. 8 and 9 were calculated for a particular geometry of the patterned top surface of the device, the trends they illustrate (i.e. poor extraction and large backscattering at glancing angles) hold for a variety of geometries of the patterned surface.

In accordance with embodiments of the invention, structures are incorporated into a III-nitride thin-film flip-chip light emitting device which may increase the extraction of light emitted at glancing incidence angles. In some embodiments, the device includes a structure that directs light away from the metal contacts by total internal reflection. In some embodiments, the device includes extraction features within the semiconductor structure which may extract glancing angle light directly, or direct the glancing angle light into smaller incidence angles which are more easily extracted from the device.

Figure 3:
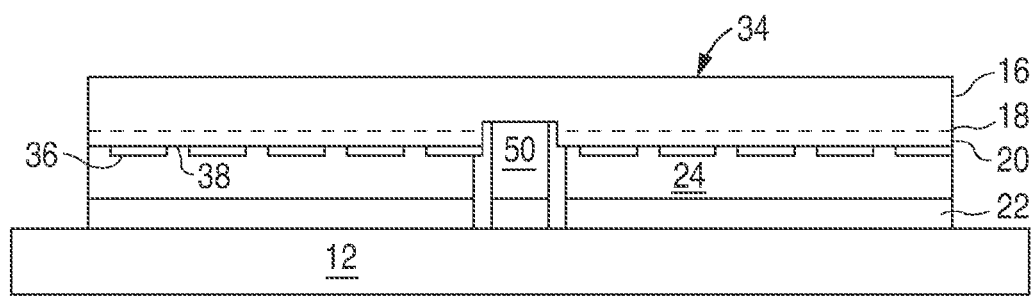
FIG. 3 illustrates a device with a nonconductive low index layer disposed between the semiconductor structure and a metal contact.
Figure 4:
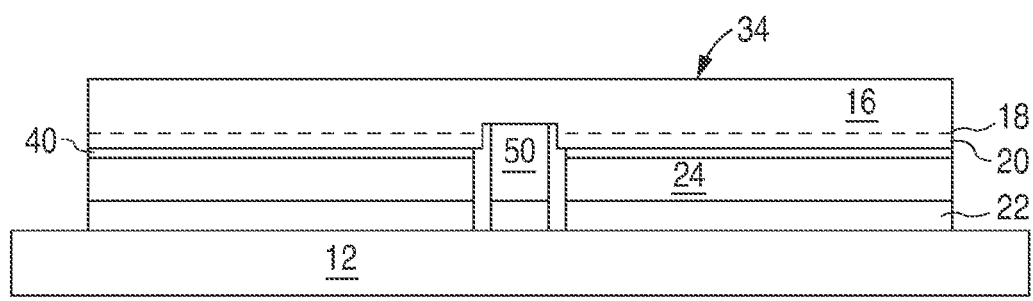
FIG. 4 illustrates a device with a conductive low index layer disposed between the semiconductor structure and a metal contact.

FIGS. 3 and 4 illustrate devices with a low index of refraction layer disposed between at least a portion of the semiconductor structure and the metal p-contact. In both the devices illustrated in FIGS. 3 and 4, the low index layer preferably causes little or no optical loss. In some embodiments, the p-type region, low index layer, and p-contact are configured such that the composite reflectivity of the low index layer and reflective p-contact metal on the p-type region is greater than the reflectivity of the reflective p-contact metal only on the p-type region.

Figure 14A:
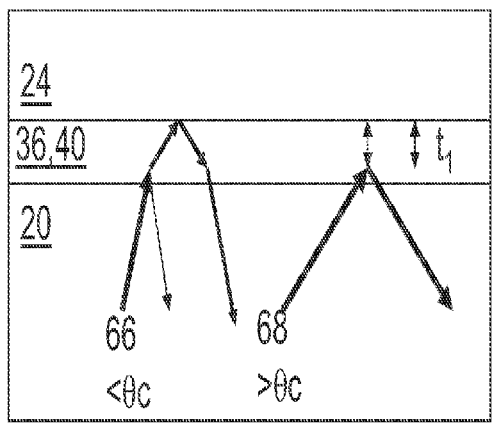
FIGS. 14A and 14B illustrate light rays incident on a GaN/low index material/metal interface.
Figure 14B:
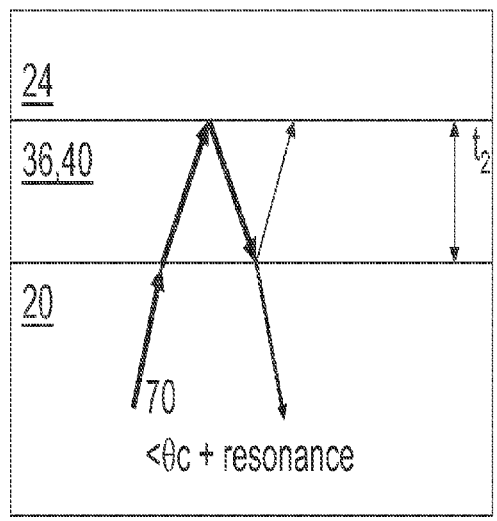

Adding a low index layer can enhance the reflectivity of the contact. The type of low index layer and its thickness are chosen such that the total reflection of light at useful angles is maximized, resulting in a reflection that is superior to a reflective metal contact without a low index layer. FIGS. 14A and 14B illustrate how light at different angles is reflected off the low index layer/metal reflective contact. Ray 66 of FIG. 14A has an incident angle that is less than the critical angle $\theta_c$ between the GaN 20 ($n=n_{GaN}$) and the low index layer 36, 40 ($n=n_{low}$), given by the formula $\theta_c = \sin^{-1}(n_{low}/n_{GaN})$. A small percentage of ray 66 is able to reflect from the low index layer 36, 40 immediately with no loss. Most of ray 66 penetrates the low index layer 36, 40 and reflects off the metal 24. For ray 66, the round-trip loss in the low index layer 36, 40 (i.e. the loss when light travels through the low index layer, is reflected of the metal layer, then travels back through the low index layer) is preferably no more than the loss of the ray reflecting directly off the metal layer 24 from the semiconductor structure 20 (without an intervening low index layer). This loss defines a maximum thickness for the low index layer—which depends on the absorption in the low-index layer—such that the reflectivity of the semiconductor/low index layer/metal reflector is better than the reflectivity of a semiconductor/metal reflector.

Figure 10:
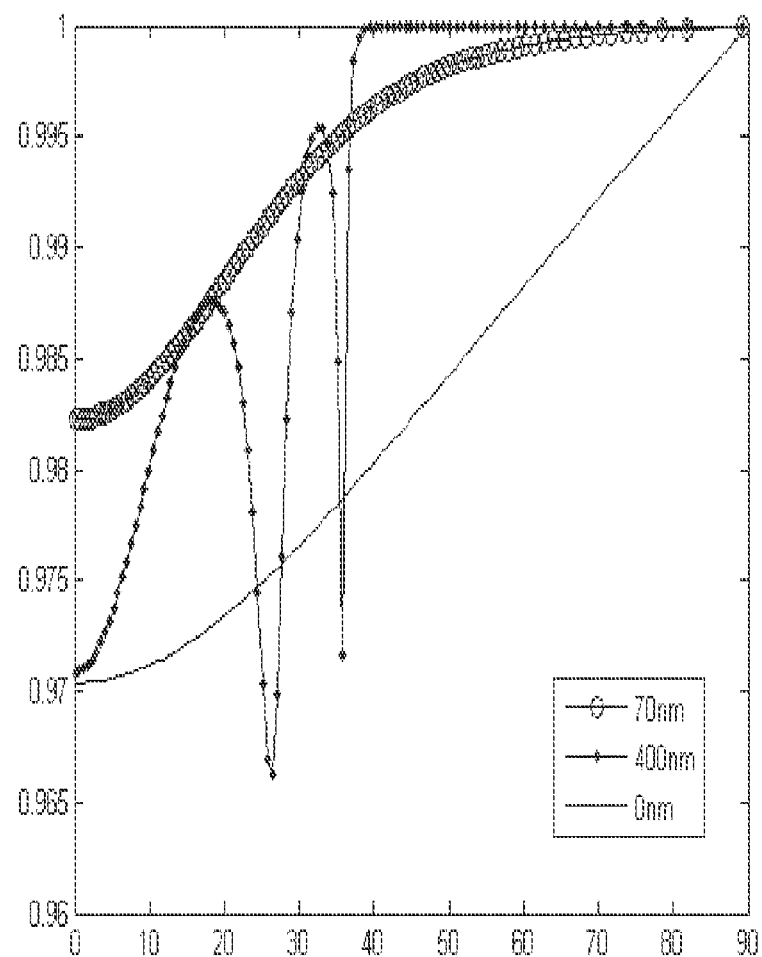
FIG. 10 is a plot of reflectivity as a function of angle of incidence for a device with a GaN p-type region, a $SiO_2$ low index layer, and a Ag contact, for three different thicknesses of $SiO_2$.

Ray 70 of FIG. 14B is also within the critical angle, but the low index layer 36, 40 is thicker and some rays can be resonantly trapped in the layer, which increases their absorption (by the metal 24 or by the low-index layer 36, 40). This effect can lower the effective reflectivity of the contact if the semiconductor 20, low index layer 36, 40, and metal layer 24 indexes and thicknesses are not chosen properly. The behavior of rays 66 and 70 are shown in FIG. 10 for a SiO$_2$ low index layer. FIG. 10 is a plot of reflectivity as a function of angle of incidence for devices with a GaN p-type region 20, a SiO$_2$ low index layer 36, and a Ag p-contact 24. Three thicknesses of SiO$_2$ are shown in FIG. 10, 0 nm (i.e. no low index layer), 70 nm, and 400 nm. For the thin SiO$_2$ layer (70 nm) there are no resonances below the critical angle (<40°) and the reflectivity is a smooth function of angle. The reflectivity is higher than Ag only. For the thicker SiO$_2$ layer (400 nm) there are two resonances below the critical angle where light is trapped in the SiO$_2$ and the reflectivity suffers. To avoid these resonances, the thickness of the low index layer needs to be less than a half-wavelength thickness in the low-index layer (taking the mirror phase shift into account). For most embodiments, the thickness of the dielectric layer is thin enough to avoid resonances, for instance less than 100 nm. In other embodiments the dielectric is thick and can support resonances, but the thickness of the semiconductor layers is chosen to minimize or eliminate light emission at these unfavorable angles.

Ray 68 of FIG. 14A shows the situation where the incidence angle is greater than the critical angle, causing total internal reflection of this glancing angle light. Reducing the amount of light that is incident on the metal contact by directing the light away by total internal reflection increases the reflectivity of the contact at angles greater than the critical angle. There is a minimum thickness for the low index layer so that a maximum in reflectivity can be achieved. Above the angle for total internal reflection, light is an evanescent wave in the low index layer, with an exponential decay length $L_{decay} = \lambda/[2\pi\sqrt{(n_{GaN}^2\sin^2\theta - n_{low}^2)}]$—where $\lambda$ is the wavelength (in vacuum), $\theta$ is the angle of light, and $n_{GaN}$ and $n_{low}$ are the optical indices of the p-material and of the low-index layer, respectively. Light does not sustain mirror losses if the thickness of the low-index layer is large enough compared to $L_{decay}$. Generally, $L_{decay} \sim 40\text{-}80$ nm depending on the value of the $\theta$ and $n_{low}$. In some embodiments, the thickness of the low-index layer is at least twice $L_{decay}$. In other embodiments, the thickness is at least $L_{decay}$.

Figure 15:
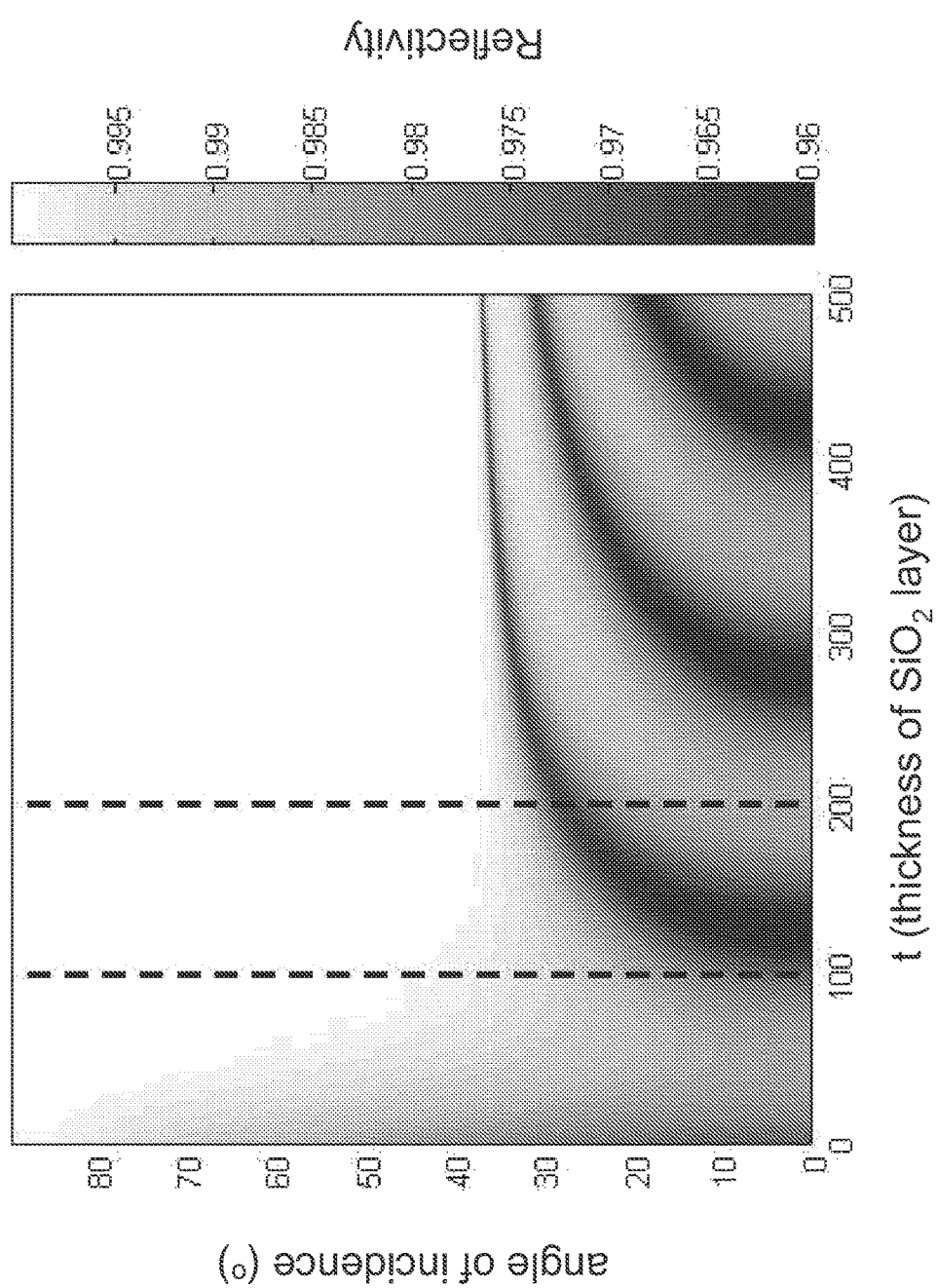
FIG. 15 illustrates reflectivity as a function of angle of incidence and of thickness t of the SiO$_2$ layer for a GaN/SiO$_2$/Ag structure.

The extraction efficiency of the device is improved by improving either or both the reflectivity of light traveling at incidence angles less than the critical angle (rays 66 and 70 in FIGS. 14A and 14B, above) or more than the critical angle (ray 68 in FIG. 14A above). FIG. 15 summarizes the effects described above in the case of a GaN/SiO$_2$/Ag structure. For a SiO$_2$ thickness t<100 nm, there are no resonances and the reflectivity overall increases with t. For larger t, resonances appear and decrease reflectivity at some angles. Two embodiments are represented by the two dashed lines, corresponding to t=100 nm and t=200 nm. These thicknesses correspond to no resonance and one resonance in the SiO$_2$ layer respectively, and both ensure a very high reflectivity (>99.9% for angles larger than 50°).

The semiconductor material at the interface with the low index layer is typically p-type GaN, which has an index of refraction of about 2.4. In some embodiments, the low index layer has an index of refraction, n, of 2 or less, more preferably 1.7 or less. By having an index of 2 or less for the low index layer, the critical angle is limited to no greater than ~55°. Therefore, all light at angles greater than the critical angle is totally internally reflected with maximum reflectivity. This includes the glancing angle light—which is hardest to extract, as shown in FIG. 8. The low index layer need only be as thick as is required to cause total internal reflection of glancing angle light.

In the device illustrated in FIG. 3, regions 36 of a non-conductive low index layer are deposited between p-type region 20 and p-contact 24. Examples of suitable low index layers include dielectrics such as SiO$_2$ (n=1.5), SiN, TiO$_2$, or Al$_2$O$_3$ and semiconductors such as ZnO. The dielectric low index layer should be thick enough to ensure reflection of glancing light (as described above); for example, at least 80 nm. In some embodiments, the dielectric low index layer is thin enough to avoid resonances as described above, for instance less than 100 nm, or thin enough to support only one resonance, for instance less than 250 nm. In other embodiments the low index layer is thicker and supports resonances, but the thickness of the semiconductor structure is tuned to avoid emitting light at the angles corresponding to the resonances supported by the low index layer. In some embodiments, the reflectivity of light incident at less than the critical angle is greater than 95%. In some embodiments, the reflectivity of light incident at greater than the critical angle is greater than 98%.

A dielectric low index layer may be deposited on the surface of p-type region 20 and patterned prior to formation of p-contact 24. A semiconductor low index layer may be grown or deposited on the surface of p-type region 20.

Current is injected in the semiconductor structure in the gaps 38 between the regions of low index material, where p-contact 24 is in direct contact with p-type region 20. Gaps 38 are large enough and spaced close enough together that current spreads in p-type region 20 from the areas in contact with p-contact 24 to the areas shielded from the p-contact by low index material 36. Spreading current in p-type GaN is difficult because its resistivity is high, ~1Ω–cm. For the contact to be effective, the gaps need to be close enough together so current can spread under the non-conductive low index layer. The p-type GaN layers in III-Nitride LEDs tend to be thin (e.g., less than 0.5 µm), which also limits the current spreading capabilities of the layer. In some embodiments, gaps 38 may be at least 100 nm wide and spaced less than 2 µm apart in some devices, less than 0.5 µm apart in some devices. In general the ratio of the area of the gaps to the total contact area is kept low for high reflectivity, but high enough to provide efficient current spreading. In some embodiments, low index layer covers 50% or more of the total area of the surface of the p-type region. The openings 38 in the low index layer may be formed by, for example, imprinting, holography, or stepper/scanner lithography techniques.

In the device illustrated in FIG. 3, and in other devices described herein, the growth substrate may be removed from the device. In embodiments where the growth substrate is removed, the top surface 34 of the device exposed by removing the substrate may be randomly roughened or may be patterned with, for example, a photonic crystal. In some embodiments, the pattern of gaps 38 may be organized in a periodic fashion to increase or compliment the light extracting effect of the photonic crystal formed in the top surface 34. For example, the parameters of the pattern of gaps 38 (such as the type of crystal or quasicrystal lattice, pitch, filling factor, depth and shape of the gaps) can be tuned to extract light which is not well extracted by the photonic crystal formed in top surface 34. Also, the parameters can be tuned to enhance the directionality of this extracted light so that it adds to the directional light extraction of the photonic crystal. In one embodiment, the pitch and lattice type of the pattern of gaps 38 are the same as that of the photonic crystal, for example, the pitch is on the order of 200 to 600 nm.

In the device illustrated in FIG. 4, a conductive low index layer 40 is disposed between p-type region 20 and p-contact 24. Because low index layer 40 is conductive, the entire interface between p-type region 20 and p-contact 24 can be covered with low index layer 40. The low index layer also makes a good contact with the p-type layer 20. The specific contact resistance is preferably $1\times10^{-2}$ ohm–cm$^2$ or less.

In some embodiments low index layer 40 is a doped oxide such as indium tin oxide (ITO, n=1.5), InO, ZnO, $Ga_xO_y$, or CuO. The oxide can either be p-doped or n-doped, in which case a tunnel junction to the p-type region can be used. In some embodiments, the dopant is one of the constituents of the oxide (such as tin in ITO); in others the dopant is an additional element (such as P for p-type ZnO). The concentration of the dopant is high enough to ensure low contact resistance and proper electrical injection, but low enough to avoid optical absorption. For example, the amount of tin in an ITO layer may vary between 0 and 10%.

In some embodiments, a thin layer of another material (for example, a few angstroms of a metal such as Ni) is disposed between the semiconductor structure and low index layer 40, to enhance adhesion of the low index layer to the semiconductor structure and to improve the specific contact resistance at the interface between the oxide and the p-type semiconductor material.

In order to reduce the index of refraction and therefore increase the index contrast at the interface with the semiconductor, an oxide low index layer may be made porous, for example by electrical, chemical or electro-chemical wet etching. Alternatively, a porous low index layer may be formed by evaporation at angle, resulting in columnar growth with air gaps in between the columns. Since low index layer 40 is thin, it may be resistive. For example, low index layer 40 may have a resistance of up to 1 Ω–cm, which is comparable to the resistance of p-type GaN.

In some embodiments, low index layer 40 is an epitaxially-grown semiconductor layer. Typically such a low index layer is a III-nitride layer such as AlInGaN, AlGaN, or AlInN, though non-III-nitride epitaxial materials such as ZnO are possible. A low index semiconductor layer may be sufficiently doped for current to be directly injected from p-contact 24 to p-type region 20 through the low index layer. Alternatively, in the case of a thin lightly doped or undoped low index semiconductor layer, current may be injected by tunneling. In the case of tunnel injection, the surface of p-type region adjacent to the low index semiconductor layer may be highly doped to facilitate injection.

Figure 5:
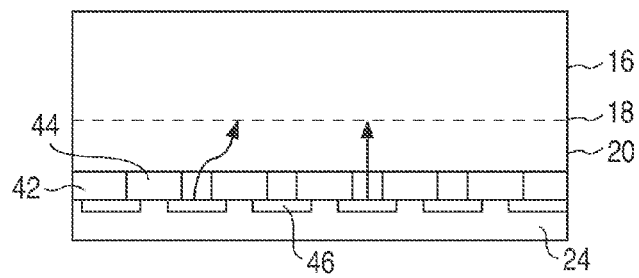
FIG. 5 illustrates a device with an oxidized low index layer formed in a portion of the semiconductor structure.

In some embodiments, a low index semiconductor layer is oxidized, in order to reduce the index of refraction. FIG. 5 illustrates a portion of a device with an oxidized low index layer. N-type region 16, light emitting region 18, and p-type region 20 are grown over a substrate. A semiconductor layer 42 that can be oxidized, such as AlInN, which may be lattice-matched to GaN, is grown over p-type region 20, followed by a highly doped p-type layer 46. Portions of highly doped layer 46 are removed to expose portions of the underlying to-be-oxidized layer. The remaining portions of highly doped layer 46 are protected by the mask used for patterning highly doped layer 46.

Portions of semiconductor layer 42 are then oxidized, for example by exposing the wafer, to which a small piece of In may be alloyed for current access, to an electrolyte solution of nitrilotriacetic acid dissolved in a 0.3M solution of potassium hydroxide in water, to reach a pH value of 8.5. A small current density of 20 $\mu A/cm^2$ is applied at a threshold voltage of about 3 V. The oxidation travels laterally, for example at a rate between 5 and 20 µm per hour. Only the portions of semiconductor layer 42 exposed by patterning highly doped layer 46 are oxidized. After oxidation, oxide regions 44 are amorphous oxide layers such as $Al_xO_y$, or $Al_xIn_yO_z$. At least some of the In in an AlInN layer generally remains in the oxide layer after oxidation. The In may or may not oxidize. Non-oxidized semiconductor material 42 remains between oxide regions 44. For example, the index of AlInN lattice-matched to GaN is about 2.2 (an index contrast of 8% with GaN) while the index of the same oxidized material is about 1.8.

A p-contact 24 is deposited over the structure. Current is injected into light emitting region 18 from the p-contact 24 in places where the remaining portions of highly doped layer 46 are aligned with conductive semiconductor regions 42. Oxide regions 44 are not conductive, but cause total reflection of light incident on the interface between oxide regions 44 and p-type region 20. Conductive semiconductor regions 42 may be at least 100 nm wide and spaced less than 1 µm apart, in order to provide sufficient current spreading in p-type region 20. As in the device illustrated in FIG. 3, the pattern of oxide regions 44 may be organized in a periodic fashion to increase or compliment the effect of a photonic crystal formed in the top surface of n-type region 16.

The distance between the reflective p-contact 24 and the light emitting region 18 may be optimized to control the emission diagram inside the semiconductor and the lifetime of carriers, and therefore impact the extraction efficiency and the far-field pattern of the device. Placement of the light emitting region is described in more detail in U.S. Pat. No. 6,903,376, which is incorporated herein by reference. The addition of a low index layer may increase the optical length from the light emitting layers to the reflector. To achieve an optimized emission diagram, the phase shift of light from the center of the light emitting region 18 to the metal mirror 24 (including the metal phase shift) needs to be resonant, as in a resonant cavity LED. In some embodiments, the optical distance between the center of the light emitting region 18 and metal reflector 24 is an odd multiple of a quarter wavelength of light emitted by the light emitting region 18, minus the phase of the reflective metal 24.

FIGS. 6, 7, 11 and 12 illustrate devices including extraction features which may extract glancing angle light directly, or direct the glancing angle light into smaller incidence angles which are more easily extracted from the device. The devices of FIGS. 6, 7, 11 and 12 include macroscopic light extraction features, extending from the top or the bottom surface of the semiconductor structure. The light extraction features may be, for example, bumps or cones which interrupt the semiconductor structure. The features illustrated in FIGS. 6, 11, and 12 may be cavities etched in the semiconductor structure at the same time as the mesa on which the n-contact is formed.

Figure 6:
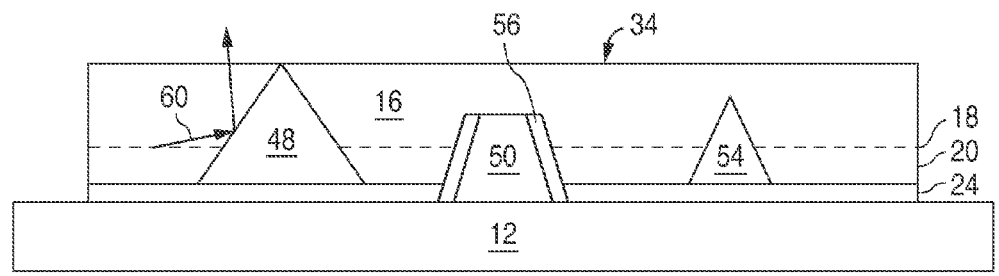
FIG. 6 illustrates a device including light extraction features that extend into the semiconductor structure from the surface on which the p-contact is formed.

In the device illustrated in FIG. 6, two light extraction features 48 and 54 are shown. The light extraction feature size, shape, and spacing are selected to direct glancing angle light out of the device, as illustrated by ray 60, or into a smaller incidence angle where it can be more easily extracted. The light extraction features may extend through the entire thickness, as illustrated by feature 48, though they need not, as illustrated by feature 54. In some embodiments, taller features more efficiently redirect glancing angle light because a smaller fraction of the glancing angle light can propagate above the feature without being redirected. The features illustrated in FIG. 6 are filled with a dielectric material, or with air. Dielectric material may be formed in the features at the same time as dielectric layer 56, which is deposited and patterned to electrically isolate n-contact 50 from the light emitting region and the p-type region.

Figure 11:
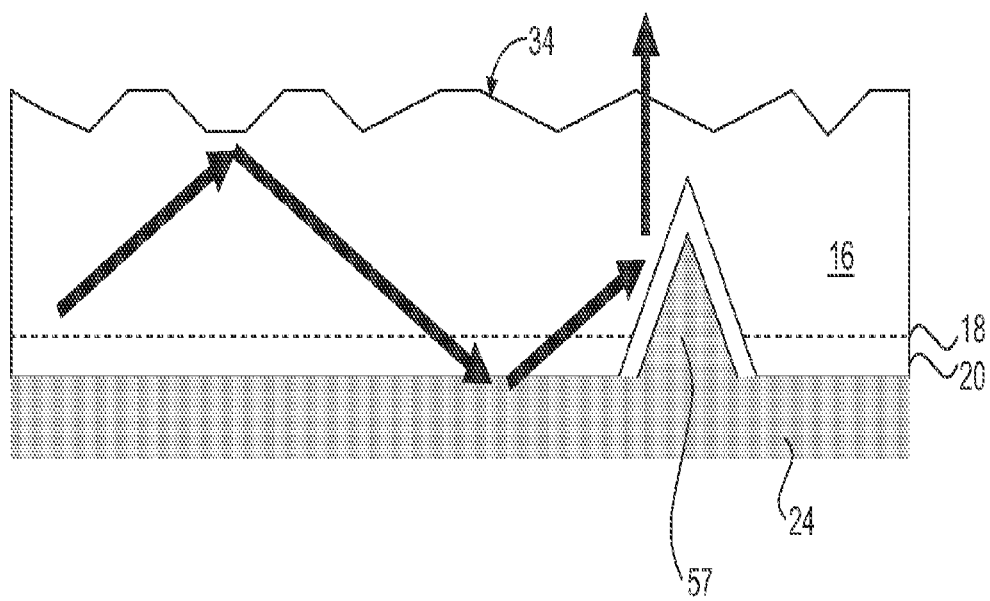
FIG. 11 illustrates a device including light extraction features coated with a thin dielectric layer and filled with metal.

In the device illustrated in FIG. 11, feature 57 is lined with a thin dielectric layer (with a thickness on the order of a wavelength or less) and filled with a reflective metal deposited at the same time as p-contact 24. As described above, the dielectric layer is kept thin and its precise thickness is tuned in order to avoid optical resonances such as those illustrated in FIG. 10, and thus ensure good reflectivity.

Figure 12:
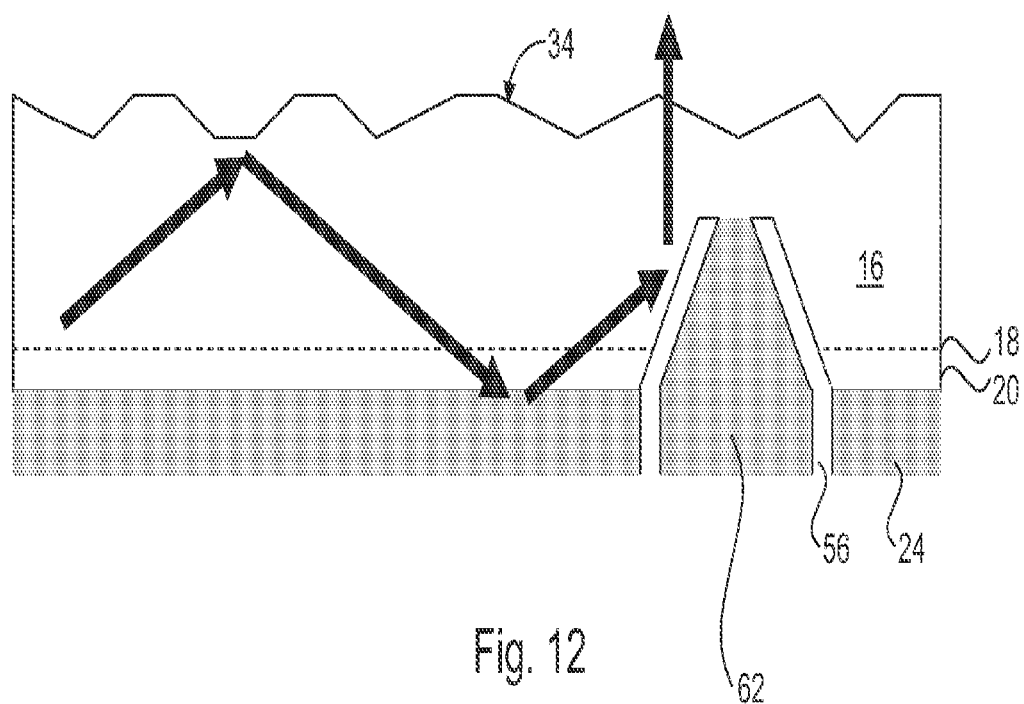
FIG. 12 illustrates a device including light extraction features which are partially coated by a dielectric layer and also serve as n-contacts.

In the device illustrated in FIG. 12, the dielectric layer is not present at the top of the extracting feature, so electrical contact is made between the metal lining the feature and the n-type region 16. The feature can then be used as an n contact, either replacing the conventional n-contacts of the device or supplementing them. In such embodiments, the extracting feature is electrically isolated from the p-contact below the device layers, for example by a dielectric layer deposited at the same time as the dielectric layer used to coat the feature.

Figure 13:
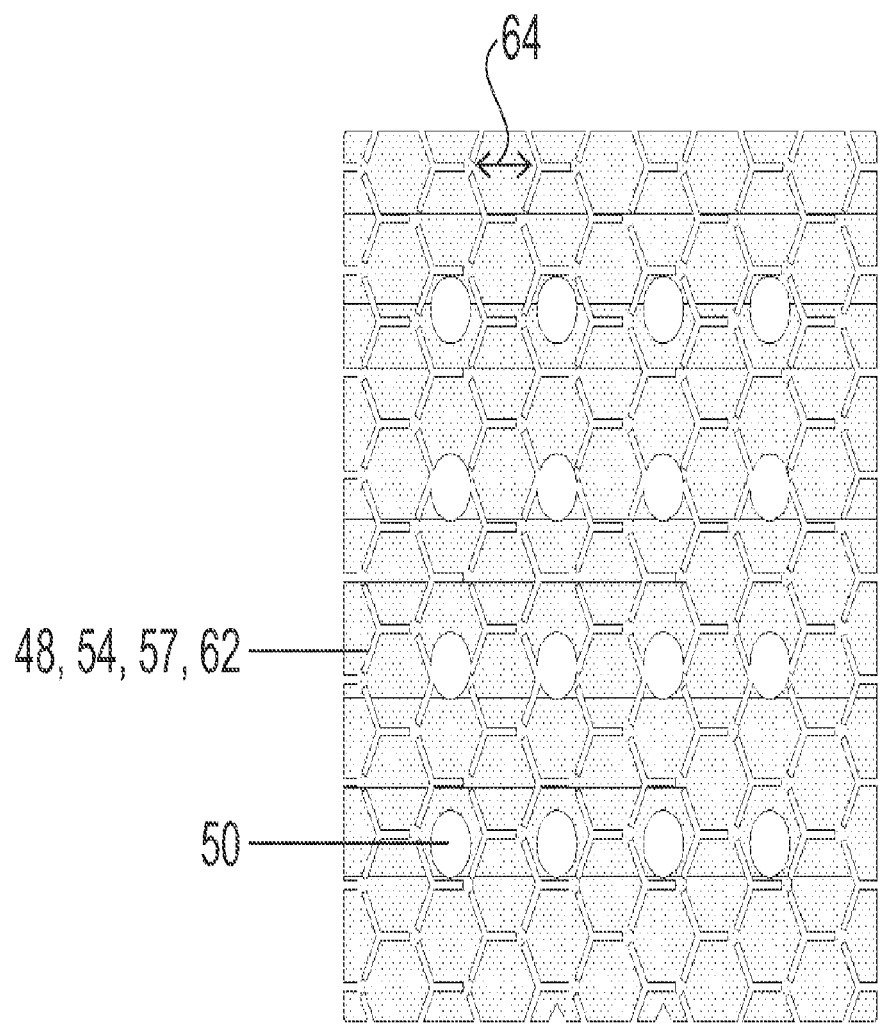
FIG. 13 is a top view of the layout of light extraction features and n-contacts in a device.

The distance between adjacent features is short enough that the glancing angle light reaches the features without being absorbed in the structure. These features are spaced much farther apart, for example between 10 and 300 µm apart, than the features formed for example in a photonic crystal in the top surface 34 of the device, which are spaced, for example, less than 1 µm apart. Devices with larger absorption require shorter distances. The absorption depends on the reflectivity of the mirrors and metal in the device, and also on the active region. For example, a device with more active material is in general more absorbing. The distance between features is large enough that only a small fraction of the device's light emitting region area, for example, no more than 50%, is lost to the features. For instance, if the features are between 2 and 5 µm wide, an average separation of 50 to 200 µm between features corresponds to a loss in emitting area on the order of 10%. In some embodiments, the features are sized and spaced such that all trajectories of glancing angle light impinge on a feature within a short enough distance, for example at most 50 µm FIG. 13 shows a top view such an embodiment, where the features 48, 54, 57, and 62, as described in the text accompanying FIGS. 6, 11, and 12, form cavities on which glancing light impinges after at most a few tens of microns of travel within the device, while the fraction of the surface used by the features is smaller than the surface dedicated to the p-contact. The spacing 64 between features may be, for example, between 50 and 150 µm, often 100 µm. In general, the extracting features are located on the outside of the device and within the device. They are not used to electrically separate the device into more than one device, as illustrated in FIG. 13 where the shaded area represents the p-contact 24 and also the p-type region below the p-contact (e.g. p-type region 20 of FIG. 6). The features are designed so that p-contact is one continuous piece, not separated throughout the device. In some embodiments, only some of the features also function as contacts to the n-type region. The number of features functioning as contacts areas may be minimized to increase the reflectivity of these features.

In general, the dimensions of these features are large, for example several times the wavelength of light, so that they reflect light in a geometric way. The sidewall angle of the features is chosen in order to maximize their efficiency. Since glancing angle light propagates near 90° in the material, it is expected that a feature with sidewall angles near 45°, for example, between 35 and 55°, will efficiently extract glancing angle light. In the case of a photonic crystal formed in the top surface 34, the features' properties can further be optimized to increase the directionality of the device by optimizing their sidewall angles and their in-plane distribution to extract light in preferential directions.

Figure 7:
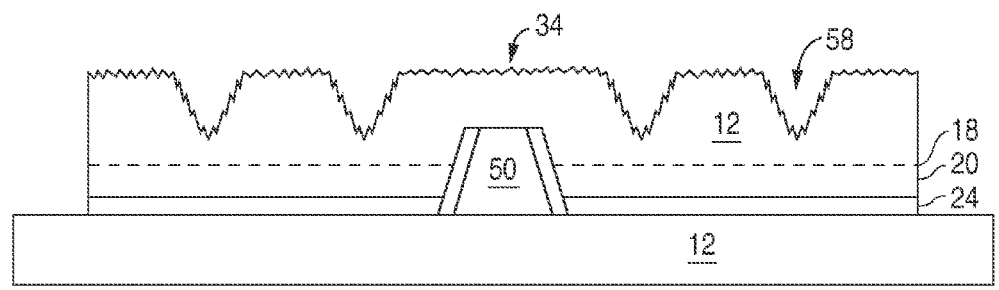
FIG. 7 illustrates a device including light extraction features that extend into the semiconductor structure from the surface from which light exits the device.

In the device illustrated in FIG. 7, features 58 are formed after the growth substrate is removed, for example at the same time top surface 34 is roughened or textured with a photonic crystal structure. Cavities 58 may have the same shape, size, and spacing as the features described in FIG. 6. The sidewalls of cavities 58 may be roughened or textured, as illustrated in FIG. 7, though they need not be. The sidewall of cavities 58 may be coated with a material such as a metal, a dielectric, or a combination of the two.

Having described the invention in detail, those skilled in the art will appreciate that, given the present disclosure, modifications may be made to the invention without departing from the spirit of the inventive concept described herein. For example, though in FIGS. 3, 4, 6, and 7, only one n-contact via is illustrated, a device may have multiple n-contact vias. Also, the features of the devices illustrated in FIGS. 3, 4, and 5 may be combined with the features of the devices illustrated in FIGS. 6, 7, 11, 12, and 13. Therefore, it is not intended that the scope of the invention be limited to the specific embodiments illustrated and described.

What is claimed is:

1. A light emitting device comprising:
   a substrate;
   a semiconductor structure comprising a light emitting layer disposed between an n-type region and a p-type region and having a first surface adjacent the substrate and a second surface opposite the first surface, the first surface having a plurality of cavities formed therein and extending into at least one of the n-type region and the p-type region, the plurality of cavities being spaced apart and lined by a dielectric layer, at least a portion of the second surface is roughened to form a plurality of features spaced apart at a distance smaller than a distance between each of the plurality of cavities formed in the first surface to enhance extraction of light emitted from the light emitting layer; and
   at least one contact disposed between the first surface of the semiconductor structure and the substrate.

2. The light emitting device of claim 1, wherein each of the plurality of cavities has a pentagon-shaped cross-section.

3. The light emitting device of claim 2, wherein sidewalls of each of the plurality of cavities have sidewall angles between 35° and 55°.

4. The light emitting device of claim 1, wherein the first surface is a surface of the p-type region and the at least one contact is at least one p-contact, or the first surface is a surface of the n-type region, and the at least one contact is at least one n-contact.

5. The light emitting device of claim 1, further comprising at least one other contact contacting the second surface of the semiconductor structure.

6. The light emitting device of claim 1, wherein at least one of a size, a shape and a spacing of the plurality of cavities is selected to direct light incident on the plurality of cavities, at a range of angles greater than 70° relative to a normal to the second surface, out of the semiconductor structure via the second surface.

7. The light emitting device of claim 1, wherein a thickness of the dielectric layer is a wavelength or less and is selected to avoid optical resonances.

8. The light emitting device of claim 1, wherein the plurality of cavities are filled with air.

9. The light emitting device of claim 1, wherein the plurality of cavities are fully lined with the dielectric layer.

10. The light emitting device of claim 1, wherein the plurality of cavities are further coated with a metal layer.

* * * * *